(12) United States Patent
Ikeda et al.

(10) Patent No.: US 11,715,698 B2
(45) Date of Patent: Aug. 1, 2023

(54) WIRING SUBSTRATE

(71) Applicant: IBIDEN CO., LTD., Gifu (JP)

(72) Inventors: Tomoyuki Ikeda, Ogaki (JP); Yoshinori Takenaka, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 9 days.

(21) Appl. No.: 17/569,837

(22) Filed: Jan. 6, 2022

(65) Prior Publication Data

US 2022/0223532 A1    Jul. 14, 2022

(30) Foreign Application Priority Data

Jan. 8, 2021   (JP) .................................. 2021-002139

(51) Int. Cl.
*H01L 21/00* (2006.01)
*H01L 23/538* (2006.01)
*H01L 21/48* (2006.01)

(52) U.S. Cl.
CPC ...... *H01L 23/5386* (2013.01); *H01L 21/4857* (2013.01); *H01L 23/5383* (2013.01)

(58) Field of Classification Search
CPC ............. H01L 23/5386; H01L 23/5383; H01L 21/4857
USPC ......................................................... 174/254
See application file for complete search history.

(56) References Cited

U.S. PATENT DOCUMENTS

2020/0389969 A1* 12/2020 Ikeda ..................... H05K 1/025

FOREIGN PATENT DOCUMENTS

| JP | 2014027212 A | * | 2/2014 | ............. H05K 1/024 |
| JP | 2015-041630 A | | 3/2015 | |

* cited by examiner

*Primary Examiner* — Andargie M Aychillhum
(74) *Attorney, Agent, or Firm* — Oblon, McClelland, Maier & Neustadt, L.L.P.

(57) ABSTRACT

A wiring substrate includes a core substrate, and a build-up part formed on the core substrate and including insulating layers and conductor layers. The conductor layers include one or more conductor layers each having a first wiring and a second wiring such that the second wiring has a conductor thickness smaller than a conductor thickness of the first wiring and that a minimum value of a line width of a wiring pattern of the second wiring is smaller than a minimum value of a line width of a wiring pattern of the first wiring.

20 Claims, 6 Drawing Sheets

WIRING SUBSTRATE

CROSS-REFERENCE TO RELATED APPLICATIONS

The present application is based upon and claims the benefit of priority to Japanese Patent Application No. 2021-002139, filed Jan. 8, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-41630 describes a wiring substrate in which multiple wiring layers (conductor layers) and insulating layers are laminated using a build-up method on both upper and lower sides of a core substrate. A wiring layer near the core substrate in the wiring substrate is formed to have a line/space (L/S) of about (20 μm)/(20 μm) and a thickness of about 15-20 μm. In one surface-layer part of the wiring substrate, a fine wiring layer having a line/space (L/S) of (10 μm)/(10 μm) or less and a thickness of about 1-5 μm is formed. A thickness (conductor thickness) of a single wiring layer in the wiring substrate is the same within the wiring layer. The entire contents of this publication are incorporated herein by reference.

SUMMARY OF THE INVENTION

According to one aspect of the present invention, a wiring substrate includes a core substrate, and a build-up part formed on the core substrate and including insulating layers and conductor layers. The conductor layers include one or more conductor layers each having a first wiring and a second wiring such that the second wiring has a conductor thickness smaller than a conductor thickness of the first wiring and that a minimum value of a line width of a wiring pattern of the second wiring is smaller than a minimum value of a line width of a wiring pattern of the first wiring.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
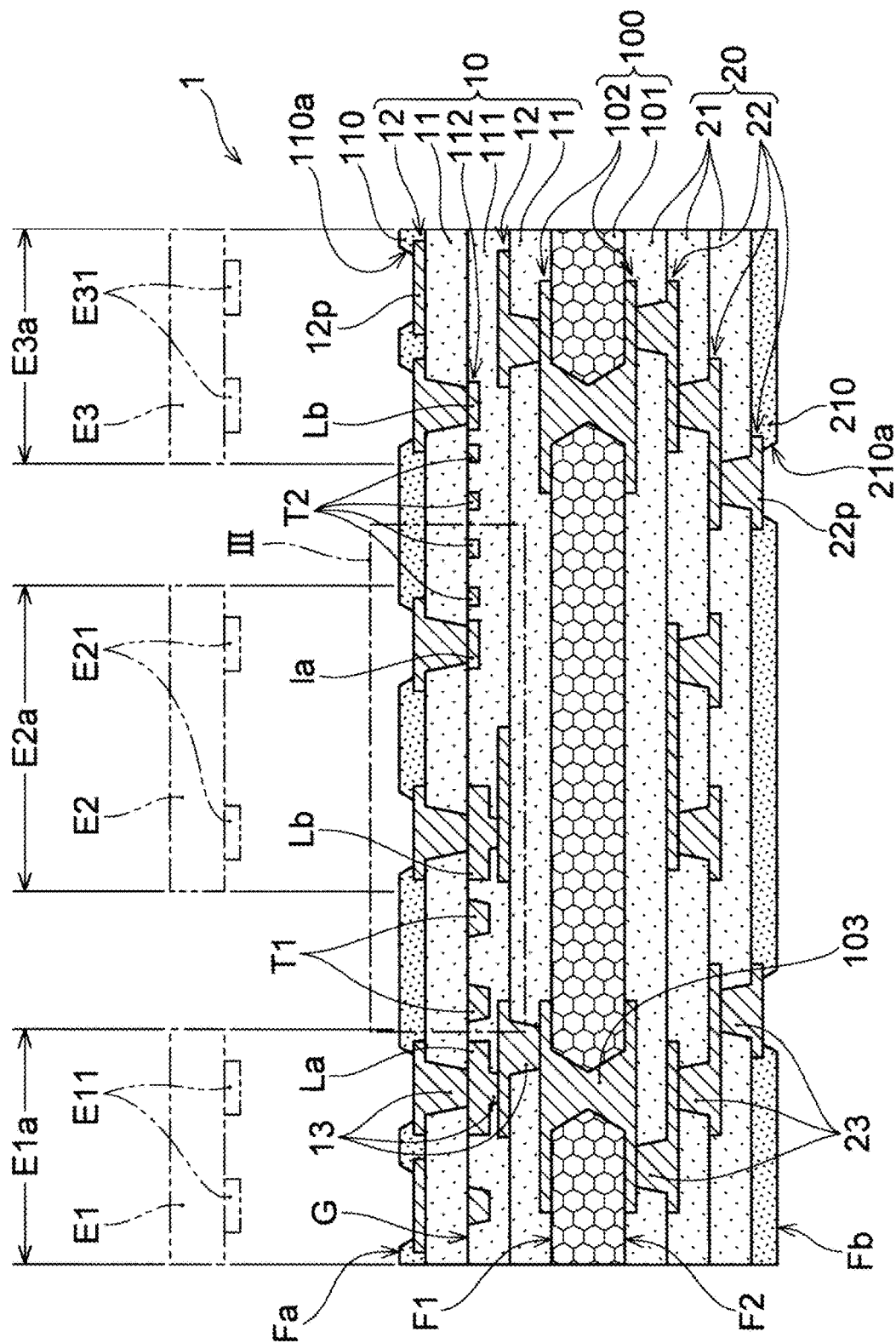
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

FIG. 1 illustrates a cross-sectional view of a wiring substrate 1 as an example structure according to an embodiment of the present invention.

As illustrated in FIG. 1, the wiring substrate 1 includes a core substrate 100 that includes an insulating layer (core insulating layer) 101 and conductor layers (core conductor layers) 102 formed on both sides of the core insulating layer 101. On each of both sides of the core substrate 100, insulating layers and conductor layers are alternately laminated. In the illustrated example, a first build-up part 10 in which insulating layers (11, 111) and conductor layers (12, 112) are laminated is formed on a one-surface (F1) of the core substrate 100. Further, a second build-up part 20 in which insulating layers 21 and conductor layers 22 are laminated is formed on the other surface (F2) of the core substrate 100.

In the description of the wiring substrate of the present embodiment, a side farther from the core insulating layer 101 is referred to as "upper," "upper side," "outer side," or "outer," and a side closer to the core insulating layer 101 is referred to as "lower," "lower side," "inner side," or "inner." Further, for the conductor layers and the insulating layers, a surface facing the opposite side with respect to the core substrate 100 is also referred to as an "upper surface," and a surface facing the core substrate 100 side is also referred to as a "lower surface." Therefore, for example, in the description of the first build-up part 10 and the second build-up part 20, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

A solder resist layer 110 is formed on the first build-up part 10. A solder resist layer 210 is formed on the second build-up part 20. Openings (110a) are formed in the solder resist layer 110, and conductor pads (12p) of the outermost conductor layer 12 in the first build-up part 10 are exposed from the openings (110a). Openings (210a) are formed in the solder resist layer 210, and conductor pads (22p) of the outermost conductor layer 22 in the second build-up part 20 are exposed from the openings (210a).

The outermost surface of the first build-up part 10 formed by exposed surfaces of the conductor layer 12 (the conductor pads (12p)) and the solder resist layer 110 is referred to as a first surface (Fa). The outermost surface of the second build-up part 20 formed by exposed surfaces of the solder resist layer 210 and the conductor layer 22 (the conductor pads (22p)) is referred to as a second surface (Fb). That is, the wiring substrate 1 has a first surface (Fa) and a second surface (Fb) on the opposite side with respect to the first surface (Fa) as two surfaces that spread in a direction orthogonal to a thickness direction of the wiring substrate 1.

In the insulating layer 101 of the core substrate 100, through-hole conductors 103 are formed connecting the conductor layer 102 that forms the one-surface (F1) of the core substrate 100 and the conductor layer 102 that forms the other-surface (F2) in the core substrate 100. In the insulating layers (11, 111, 21), via conductors (13, 23) connecting the conductor layers sandwiching the insulating layers (11, 111, 21) are formed.

The conductor layers (102, 12, 112, 22), the via conductors (13, 23), and the through-hole conductors 103 are formed using any metal such as copper or nickel, and, for example, are each formed of a metal foil such as a copper foil and/or a metal film formed by plating or sputtering. The conductor layers (102, 12, 112, 22), the via conductors (13, 23), and the through-hole conductors 103 are each illustrated in FIG. 1 as having a single-layer structure, but can each have a multilayer structure that includes two or more metal layers. For example, the conductor layers 102 that are respectively formed on the surfaces of insulating layer 101 can each have a three-layer structure including a metal foil, an electroless plating film, and an electrolytic plating film. Further, the conductor layers (12, 112, 22), the via conductors (13, 23), and the through-hole conductors 103 can each have, for example, a two-layer structure including an electroless plating film and an electrolytic plating film.

The insulating layers (101, 11, 111, 21) are each formed by using an insulating resin such as an epoxy resin, a bismaleimide triazine resin (BT resin) or a phenol resin. The insulating layers may each contain a reinforcing material (core material) such as a glass fiber and/or inorganic filler such as silica or alumina. The solder resist layers (110, 210) are each formed using, for example, a photosensitive epoxy resin or polyimide resin, or the like.

The conductor layers of the wiring substrate 1 are patterned to have predetermined conductor patterns. In the illustrated example, the multiple conductor pads (12p) exposed on the first surface (Fa) are formed such that, when the wiring substrate 1 is used, multiple components (E1, E2, E3) can be mounted on the wiring substrate 1. That is, the conductor pads (12p) are component mounting pads used as connecting parts when external components are mounted on the wiring substrate 1, and the first surface (Fa) of the wiring substrate 1 can be a component mounting surface including multiple component mounting regions (E1a, E2a, E3a) on which multiple components can be mounted. For example, electrodes (E1l, E21, E31) of the components (E1, E2, E3) can be electrically and mechanically connected to the component mounting pads (conductor pads) (12p) via a bonding material such as solder (not illustrated in the drawings).

Examples of the components (E1, E2, E3) that can be mounted on the wiring substrate 1 include electronic components such as active components such as semiconductor integrated circuit devices and transistors. In the illustrated example, the components (E1, E2) can be, for example, integrated circuits such as ASICs (Application Specific Integrated Circuits), or processing devices such as MPUs (Micro Processor Units), and the component (E3) can be a memory element such as an HBM (High Bandwidth Memory). That is, the wiring substrate 1 can have a form of an MCM (Multi Chip Module) in its use.

These multiple components (E1, E2, E3) can be connected to each other via the conductor pads (12p) and some of the conductor layers (12, 112, 102, 22) forming the wiring substrate 1. Specifically, as will be described later with reference also to FIG. 2, in the present embodiment, the component (E1) and the component (E2), and the component (E2) and the component (E3), can be electrically connected to each other via the conductor pads (12p), the via conductors 13, and some of wirings forming the conductor layer 112.

The second surface (Fb), which is a surface on the opposite side with respect to the first surface (Fa) of the wiring substrate 1 in the example of FIG. 1, can be a connection surface that is connected to an external wiring substrate, for example, an external element such as a motherboard of any electrical device when the wiring substrate 1 itself is mounted on the external element. Further, similarly to the first surface (Fa), the second surface (Fb) may be a component mounting surface on which an electronic component such as a semiconductor integrated circuit device is mounted. Without being limited to these, the conductor pads (22p) forming the second surface (Fb) can be connected to any substrate, electrical component, mechanism element, or the like.

Any conductor layer among the multiple conductor layers forming the wiring substrate of the embodiment can have wiring patterns of different conductor thicknesses in the same conductor layer. In the wiring substrate 1 of the illustrated example, among the conductor layers (12, 112) of the first build-up part 10, the conductor layer 112 directly below (on a one-layer inner side of, that is, on a one-layer core substrate 100 side of) the conductor layer 12 that forms the first surface (Fa) contains multiple wiring patterns having different conductor thicknesses.

In the conductor layer 112, a first wiring (T1) having a relatively large conductor thickness and a second wiring (T2) having a smaller conductor thickness than that of the first wiring (T1) are formed. These multiple wiring patterns having different conductor thicknesses can respectively transmit different electrical signals. Specifically, in this example, as will be apparent in the description with reference to FIG. 2 that follows, the first wiring (T1) is a wiring that can transmit a signal between the component (E1) and the component (E2), and the second wiring (T2) is a wiring that can transmit a signal between the component (E2) and the component (E3). By forming multiple wirings having different conductor thicknesses in the single wiring layer 112, multiple signals transmitted by the conductor layer 112 can each be transmitted by a wiring having more appropriate characteristic impedance.

Figure 2:
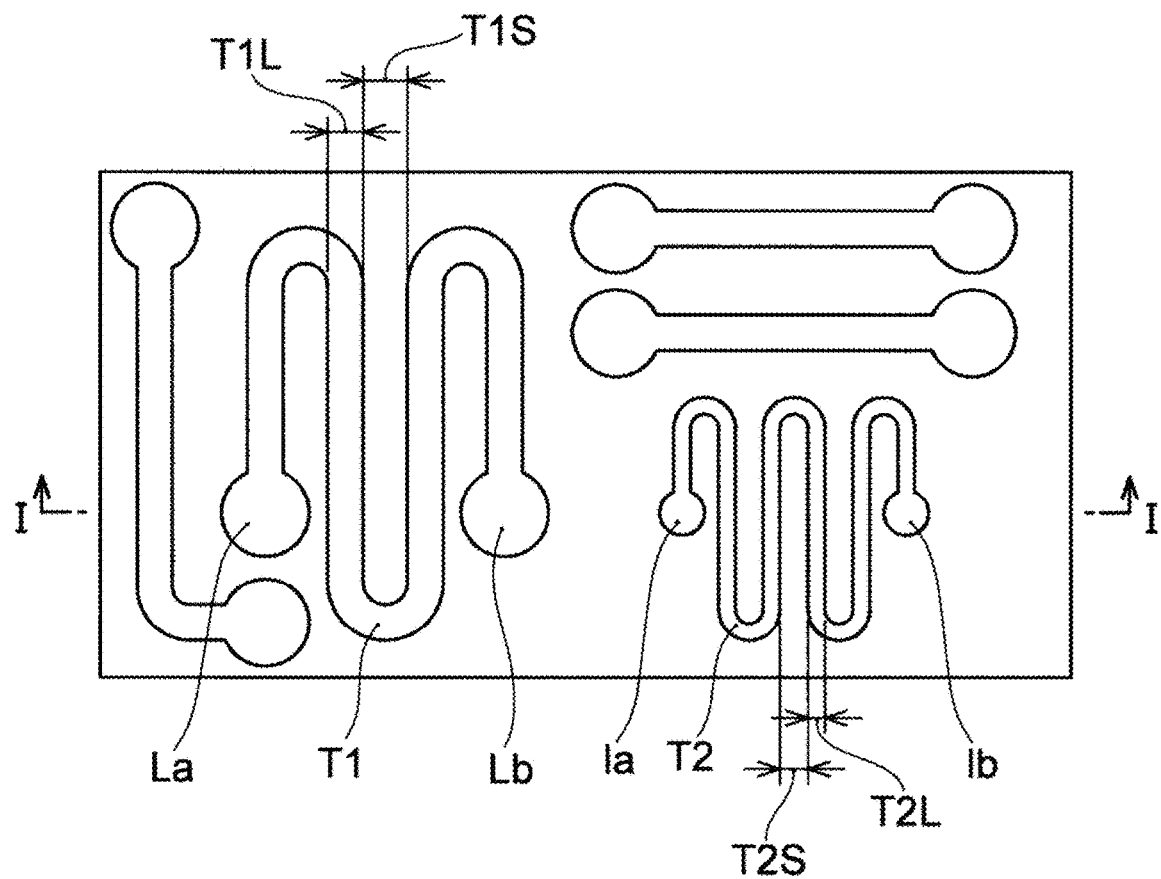
FIG. 2 is a plan view of a surface (G) in FIG. 1, which is an example of the wiring substrate according to the embodiment of the present invention.

FIG. 2 is a top view of the wiring substrate 1 in a state in which the conductor layer 112 having the first wiring (T1) and the second wiring (T2) is exposed, and is a plan view of a surface (G) illustrated in FIG. 1. That is, FIG. 2 is a plan view of the wiring substrate 1 in a state in which the upper side structural elements from the outermost insulating layer 11 (the insulating layer 11, the conductor layer 12, and the solder resist layer 110) in the first build-up part 10 are removed. The term "plan view" means viewing an object along the thickness direction of the wiring substrate 1. FIG. 1 illustrates a cross section along an I-I line illustrated in FIG. 2.

As illustrated in FIG. 2, the first wiring (T1) is formed as a wiring pattern having relatively large line width and inter-line distance. The second wiring (T2) is formed as a wiring pattern having smaller line width and inter-line distance than those of the first wiring (T1). In the illustrated example, the first wiring (T1) has land parts (La, Lb) at both ends thereof, and the second wiring (T2) has land parts (la, lb) at both ends thereof.

For example, the first wiring (T1) has a line width (T1L) with a minimum value of 10 μm or more, and has an inter-line distance (T1S) with a minimum value of 10 μm or more. For example, the second wiring (T2) has a line width (T2L) with a minimum value of 6 μm or less, and has an inter-line distance (T2S) with a minimum value of 6 μm or less. That is, the first wiring (T1) is structured as a wiring layer having a relatively large conductor thickness and a relatively large line/space, and the second wiring (T2) is structured as a fine wiring layer having a relatively small conductor thickness and a relatively small line/space.

As described above, by forming patterns having different conductor thicknesses and L/S (line/space) values in the same conductor layer, transmission quality of signals transmitted in the wiring substrate may be improved. Specifically, by adjusting the conductor thickness and L/S, the characteristic impedance of each of the first wiring (T1) and the second wiring (T2) can be adjusted to a more desirable value. Wirings that respectively have appropriate characteristic impedances with respect to multiple electrical signals transmitted in a single conductor layer can be provided. In other words, a degree of freedom in wiring design can be improved as compared to a case where wiring thicknesses (conductor thicknesses) are uniform in the same conductor layer.

FIG. 1 is referred to again. The land parts (La, Lb, la, lb) provided at the both ends of the first and second wirings (T1, T2) are connected to the component mounting pads (12p) via the via conductors 13 penetrating the insulating layer 11 directly above the land parts. In the illustrated example, the land parts (La, Lb) have a conductor thickness equal to the conductor thickness of the first wiring (T1), and the land parts (la, lb) have a conductor thickness equal to the conductor thickness of the second wiring (T2). The land part (La) is connected to a component mounting pad (12p) on which the component (E1) can be mounted, and the land part (Lb) is connected to a component mounting pad (12p) on which the component (E2) can be mounted. The land part (la) is connected to a component mounting pad (12p) on which the component (E2) can be mounted, and the land part (lb) is connected to a component mounting pad (12p) on which the component (E3) can be mounted. That is, the first wiring (T1) and the second wiring (T2) connect the component mounting pads (12p) included in different component mounting regions among the multiple component mounting regions (E1a, E2a, E3a).

The first wiring (T1) having the above connection structure forms a part of a bridge wiring that connects the component (E1) and the component (E2), and the second wiring (T2) having the above connection structure forms a part of a bridge wiring that connects the component (E2) and the component (E3). The first wiring (T1) that has relatively large conductor thickness and L/S forms a wiring that transmits a signal between the component (E1) and the component (E2), which are, for example, microprocessors. The second wiring (T2) that has relatively small conductor thickness and L/S can be a bus line that transmits a signal between the component (E3), which is, for example, a memory element, and the component (E2), which is a microprocessor.

Figure 3:
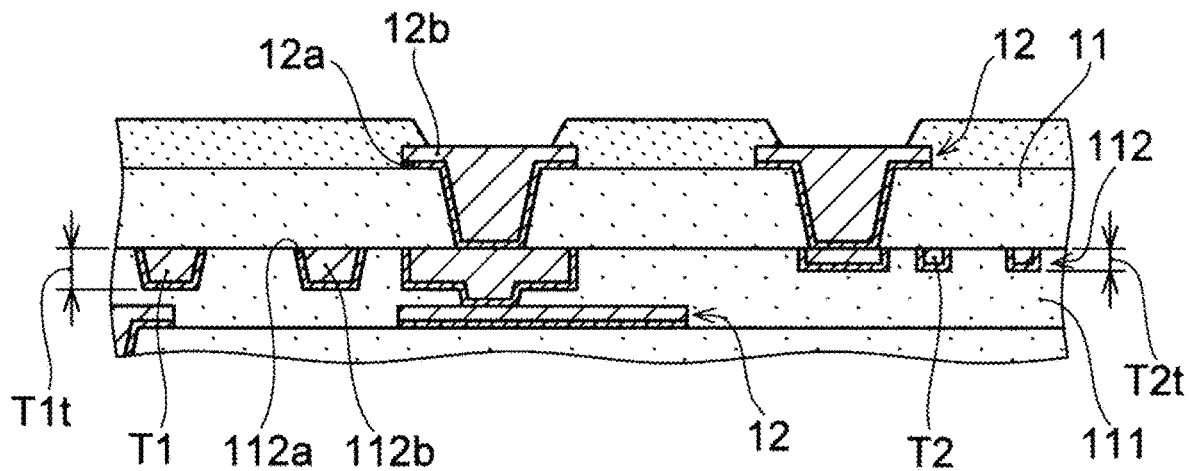
FIG. 3 is an enlarged view of a portion (III) in FIG. 1, which is an example of the wiring substrate according to the embodiment of the present invention.

FIG. 3 illustrates an enlarged view of a region (III) surrounded by a one-dot chain line in FIG. 1. As illustrated, the conductor layer 112 having the first wiring (T1) and the second wiring (T2) has a form of embedded wirings embedded in the insulating layer 111 on a lower side thereof. The conductor thickness (T1t) of the first wiring (T1) is, for example, 10 μm or more and 35 μm or less, and the conductor thickness (T2t) of the second wiring (T2) is, for example, less than 10 In the illustrated enlarged view, an example is illustrated in which the conductor layers (12, 112) are each formed of a two-layer structure including an electrolytic plating film layer (12a, 112a) and an electrolytic plating film layer (12b, 112b).

As described above, the first and second wirings (T1, T2) are wirings for signals transmitted between different electronic components, and the signals can be high frequency signals. Therefore, the insulating layer 111 in which the conductor layer 112 having the first and second wirings (T1, T2) is embedded preferably has excellent high frequency characteristics.

When an insulating layer in contact with a wiring has relatively high dielectric constant and dielectric loss tangent, a dielectric loss (transmission loss) of a high frequency signal transmitted via the wiring is relatively large. The dielectric loss tends to be large when the frequency of the signal is high. In particular, when a high frequency signal in the microwave or millimeter wave region is transmitted, the dielectric loss can be significantly large. Therefore, for the insulating layer 111 in which the conductor layer 112 is embedded, a material having relatively small dielectric constant and dielectric loss tangent is preferably used, and, at a frequency of 1 GHz, a relative permittivity is preferably 3.5 or less and a dielectric loss tangent is preferably 0.005 or less.

Regarding the relative permittivity and the dielectric loss tangent of an insulating layer described above, it is more preferable that the insulating layer 11 directly above the conductor layer 112 similarly has a relative permittivity of 3.5 or less and a dielectric loss tangent of 0.005 or less at a frequency of 1 GHz. Since all the insulating layers in contact with the conductor layer 112 have excellent high frequency characteristics, the conductor layer 112 can have even more excellent signal transmission quality.

In transmission of an electric signal, when surface roughness of a wiring surface is high, a loss due to a skin effect of a transmission signal is large, and thus, transmission quality of the signal is impaired. Therefore, when the upper surface of the conductor layer 112 has a relatively low surface roughness, it is possible that a scattering loss of a signal transmitted via the conductor layer 112 is reduced. From this point of view, the upper surface of the conductor layer 112 is formed to have a relatively low surface roughness. Specifically, an arithmetic mean roughness of the upper surface of conductor layer 112 (arithmetic mean of absolute values of varying heights relative to a reference line) (Ra) is less than 0.3 μm. The arithmetic mean roughness (Ra) of the upper surface of the conductor layer 112 is more preferably 0.15 μm or less.

Figure 4:
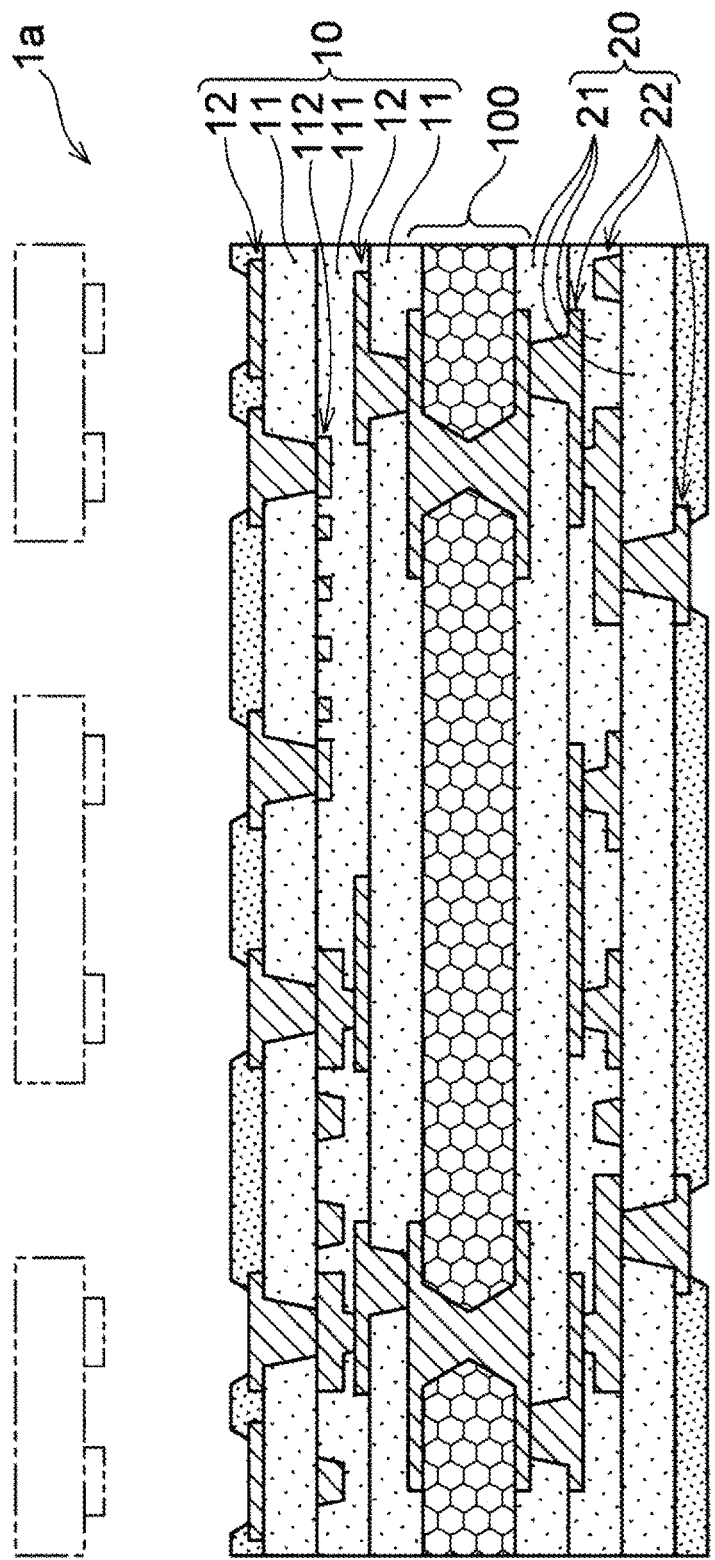
FIG. 4 is a cross-sectional view illustrating another example of the wiring substrate according to the embodiment of the present invention.

In the wiring substrate 1, among the conductor layers that form the first build-up part 10, the conductor layer 112 on the one-layer inner side of the outermost conductor layer 12 is formed as embedded wirings and includes the first wiring (T1) and the second wiring (T2) that have different conductor thicknesses. However, it is also possible that multiple conductor layers of such a form are formed in the wiring substrate. FIG. 4 illustrates a wiring substrate (1a) as an example in which, in the second build-up part 20, a conductor layer 22 of the same rank as that of the conductor layer 112 in the first build-up part 10 is formed as embedded wirings. The term "rank" is a number assigned to each of the conductor layers (12, 112, 22) when the number that increases by 1 for each layer starting from the core substrate 100 side is sequentially assigned starting from 1 to each of the multiple conductor layers (12, 112, 22) laminated in each of the first build-up part 10 and the second build-up part 20. Since the embedded wirings of the second build-up part 20 are formed with the same rank as that in the first build-up part 10, symmetricity in the thickness direction of the wiring substrate is improved, and warpage of the wiring substrate may be suppressed.

Figure 5A:
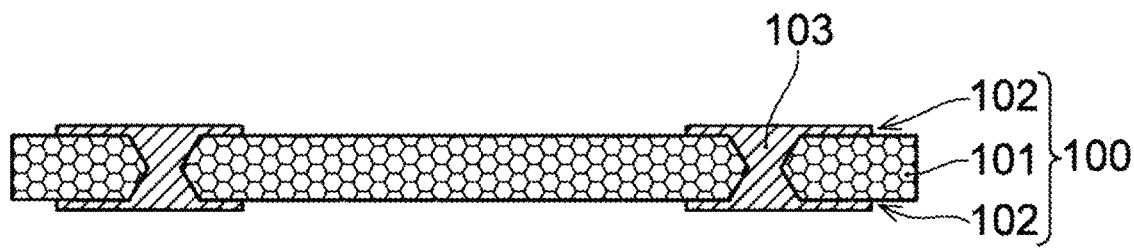
FIG. 5A is a cross-sectional view illustrating a method for manufacturing a wiring substrate according to an embodiment of the present invention.

With reference to FIGS. 5A-5I, a manufacturing method is described using a case where the wiring substrate 1 illustrated in FIG. 1 is manufactured as an example. First, as illustrated in FIG. 5A, the core substrate 100 is prepared. In the preparation of the core substrate 100, for example, a double-sided copper-clad laminated plate containing the core insulating layer 101 is prepared. Then, the core substrate 100 is prepared by using a subtractive method or the like to form the conductor layers 102 including predetermined conductor patterns on both sides of the insulating layer 101 and form the through-hole conductors 103 in the insulating layer 101.

Figure 5B:
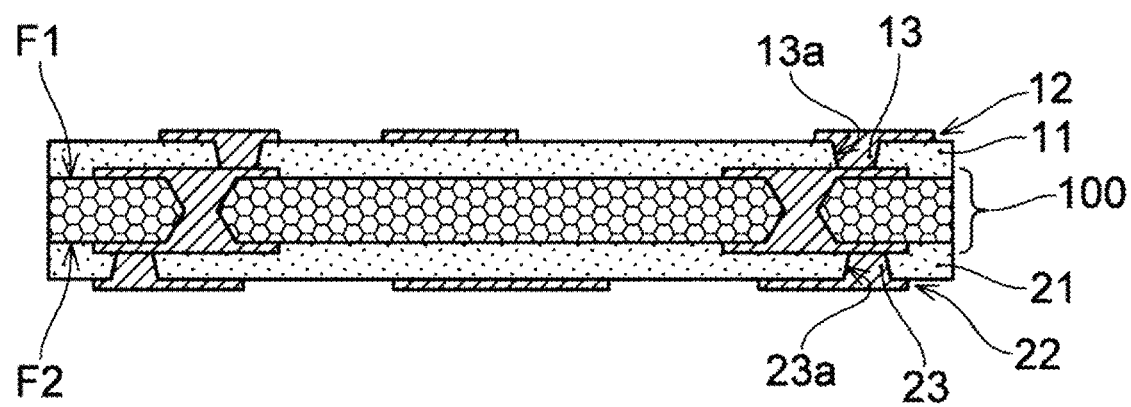
FIG. 5B is a cross-sectional view illustrating the method for manufacturing a wiring substrate according to the embodiment of the present invention.

Next, as illustrated in FIG. 5B, the insulating layer 11 is formed on the one-surface (F1) of the core substrate 100, and the conductor layer 12 is laminated on the insulating layer 11. The insulating layer 21 is formed on the other-surface (F2) of the core substrate 100, and the conductor layer 22 is laminated on the insulating layer 21. For example, the insulating layers (11, 21) are each formed by thermocompression bonding a film-like insulating resin onto the core substrate 100. The conductor layers (12, 22) are formed using any method for forming conductor patterns, such as a semi-additive method, at the same time as the via conductors (13, 23) filling openings (13a, 23a) that can be formed in the insulating layers (11, 21), for example, using laser.

Subsequently, as illustrated in 5C, the insulating layer 111 is laminated on the one-surface (F1) side of the core substrate 100, and the insulating layer 21 is laminated on the conductor layer 22 on the other-surface (F2) side. Through holes (13g) are formed in the insulating layer 111 by laser processing. The through holes (13g) are formed at positions where the via conductors 13 (see FIG. 1) that penetrate the insulating layer 111 are to be formed. Carbon dioxide laser of a relatively long wavelength of about 10 μm can be used in the formation of the through holes (13g). After the insulating layer 111 and the insulating layer 21 are laminated and before the through holes (13g) are formed, on the other-surface (F2) side of the core substrate 100, the exposed surface of the insulating layer 21 can be appropriately protected using a mask such as a PET film.

Figure 5C:
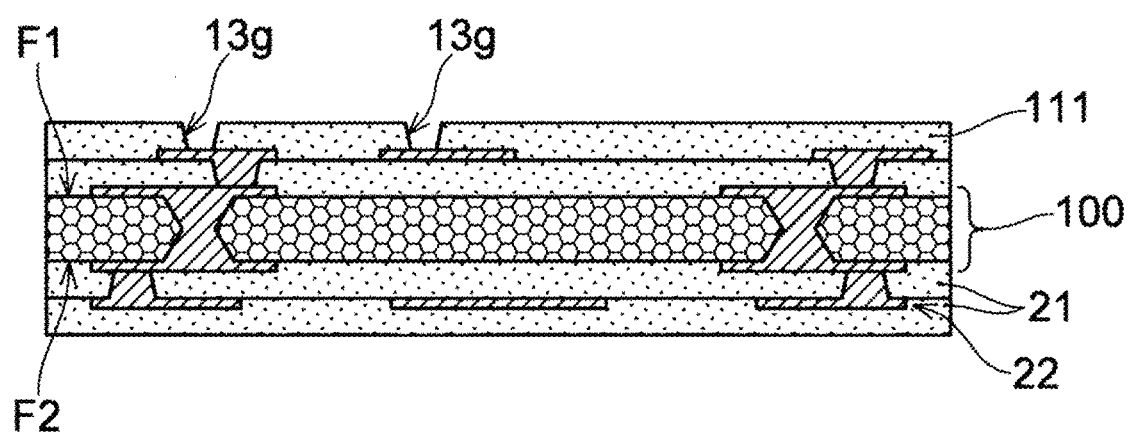
FIG. 5C is a cross-sectional view illustrating the method for manufacturing a wiring substrate according to the embodiment of the present invention.
Figure 5D:
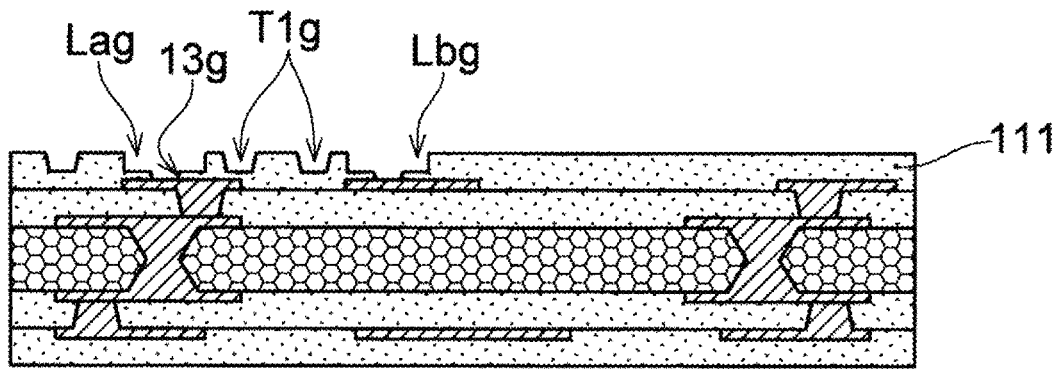
FIG. 5D is a cross-sectional view illustrating the method for manufacturing a wiring substrate according to the embodiment of the present invention.

Next, as illustrated in FIG. 5D, for example, grooves (T1g, Lag, Lbg) are formed by processing using excimer laser or the like having a relatively short wavelength and relatively excellent straightness in processing of an insulating layer. The groove (T1g) is formed according a wiring pattern that the first wiring (T1) described above is to have, and the grooves (Lag, Lbg) are formed according to positions where the land parts (La, Lb) of the first wiring (T1) are to be formed. The grooves (T1g, Lag, Lbg) are formed to have a thickness that the first wiring (T1) is to have (for example, a depth of 10.0 μm or more).

Figure 5E:
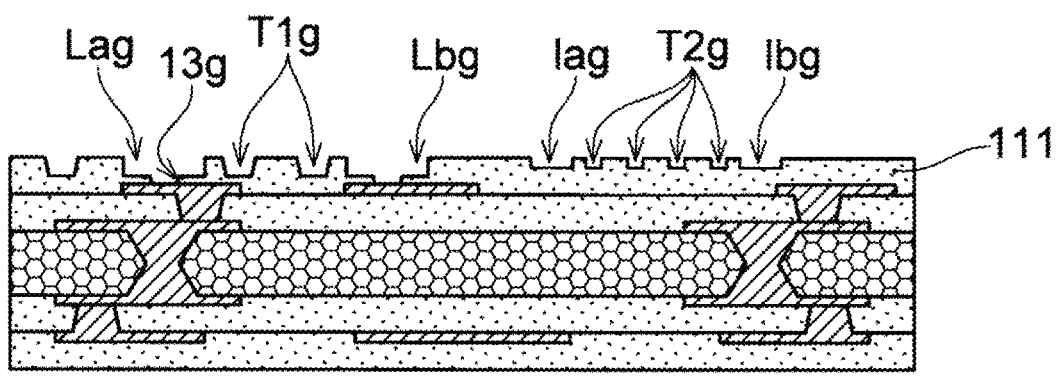
FIG. 5E is a cross-sectional view illustrating the method for manufacturing a wiring substrate according to the embodiment of the present invention.

Next, as illustrated in FIG. 5E, grooves (T2g, lag, lbg) are formed. These grooves (T2g, lag, lbg) are formed to have a thickness that the above-described second wiring (T2) has (for example, a depth of 10.0 μm or less). The groove (T2g) can be formed according a pattern that the above-described second wiring (T2) is to have and, for example, similar to the formation of the above-described grooves (T1g, Lag, Lbg), by processing using excimer laser. The grooves (lag, lbg) are formed according to positions where the land parts (la, lb) of the second wiring (T2) are to be formed.

The order of the formation of the through holes (13g), the formation of the grooves (T1g, Lag, Lbg), and the formation of the grooves (T2g, lag, lbg) described with reference to FIGS. 5C-5E can be arbitrarily changed. For example, the grooves (T2g, lag, lbg) may be formed prior to the formation of the through holes (13g) and the grooves (T1g, Lag, Lbg).

Figure 5F:
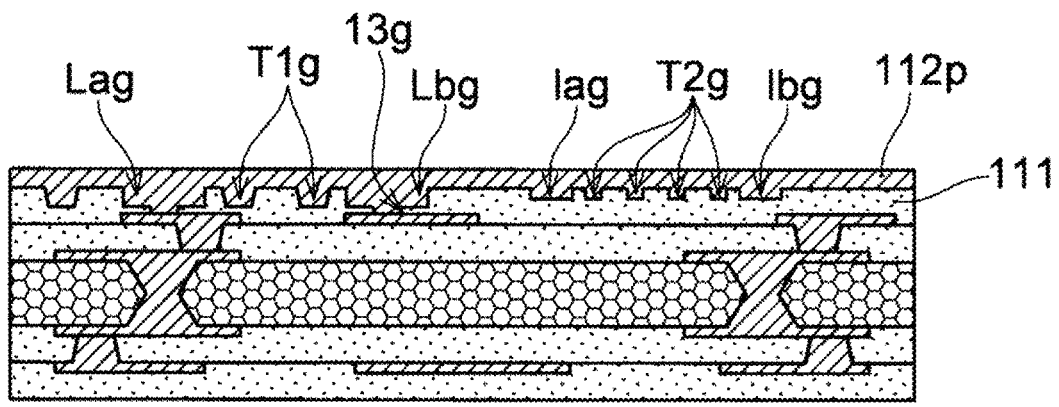
FIG. 5F is a cross-sectional view illustrating the method for manufacturing a wiring substrate according to the embodiment of the present invention.

Next, as illustrated in FIG. 5F, a conductor layer (112p) is formed to cover the entire upper surface of the insulating layer 111 (interiors of the through holes (13g), interiors of the grooves (T1g, T2g, Lag, Lbg, lag, lbg), and the outermost surface of insulating layer 111). For example, the conductor layer (112p) is formed by forming a metal film on the entire upper surface of the insulating layer 111 by electroless plating, sputtering, or the like, and then, by electrolytic plating using this metal film as a seed layer.

Figure 5G:
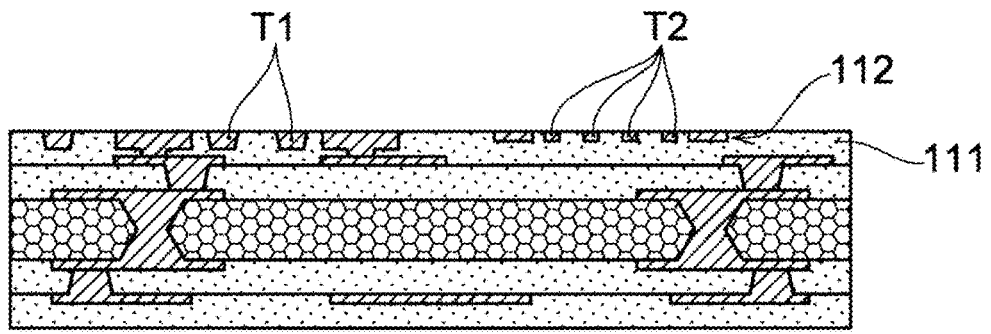
FIG. 5G is a cross-sectional view illustrating the method for manufacturing a wiring substrate according to the embodiment of the present invention.

Next, as illustrated in FIG. 5G, a portion of the conductor layer (112p) in the thickness direction is removed by polishing. A state in which the insulating layer 111 is exposed is achieved, and the formation of the conductor layer 112 that has the first wiring (T1) and the second wiring (T2) is completed. The polishing of the conductor layer (112p) is performed, for example, by chemical mechanical polishing (CMP), and the upper surface of the conductor layer 112 can have, for example, an arithmetic mean roughness (Ra) of less than 0.3 μm.

Figure 5H:
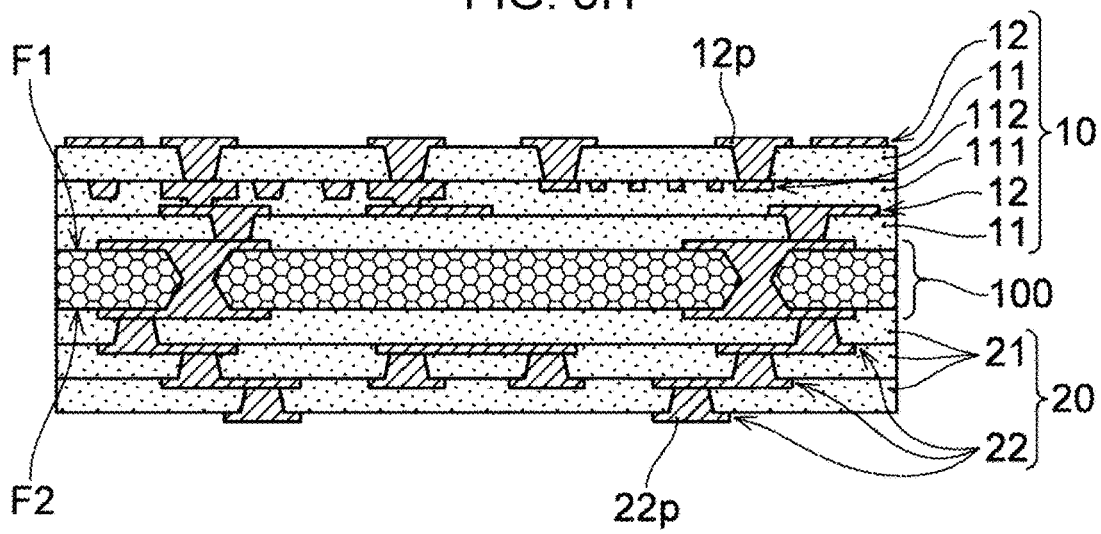
FIG. 5H is a cross-sectional view illustrating the method for manufacturing a wiring substrate according to the embodiment of the present invention.

Next, as illustrated in FIG. 5H, the conductor layer 22 is formed on the other-surface (F2) side of the core substrate 100. Subsequent, on the one-surface (F1) side of the core substrate 100, using the same method as the formation of the insulating layer 11 and the conductor layer 12 on the core substrate 100 described above, the insulating layer 11 and the conductor layer 12 are formed on the upper side of the conductor layer 112. The formation of the first build-up part 10 on the one-surface (F1) side of the core substrate 100 is completed. On the other-surface (F2) side of the core substrate 100, one insulating layer 21 and conductor layers 22 are alternately laminated. The formation of the second build-up part 20 on the other-surface (F2) side is complete. The outermost conductor layer 12 of the first build-up part 10 is formed in a pattern including the conductor pads (12p), and the outermost conductor layer 22 of the second build-up part 20 is formed in a pattern including the conductor pads (22p).

Figure 5I:
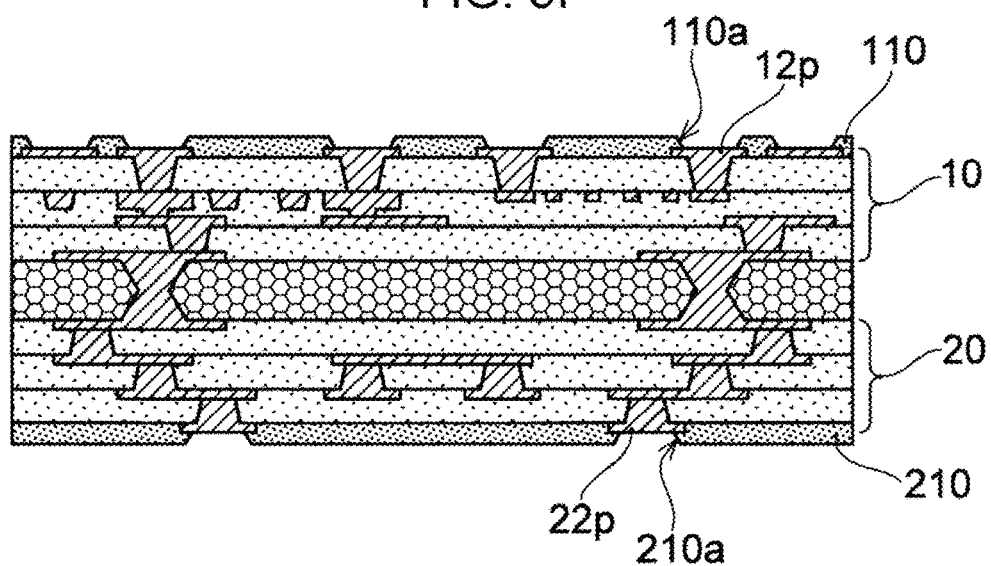
FIG. 5I is a cross-sectional view illustrating the method for manufacturing a wiring substrate according to the embodiment of the present invention.

Next, as illustrated in FIG. 5I, the solder resist layer 110 is formed on the first build-up part 10, and the solder resist layer 210 is formed on the second build-up part 20. For example, photosensitive epoxy resin films are formed by spray coating, curtain coating, or film pasting, and the openings (110a, 210a) are formed by exposure and development. The conductor pads (12p, 22p) are exposed from the openings (110a, 210a) of the solder resist layers (110, 210).

By the above processes, the formation of the wiring substrate 1 is completed. A protective film (not illustrated in the drawings) may be formed on the exposed surface of each of the conductor pads (12p, 22p). For example, the protective film formed of Ni/Au, Ni/Pd/Au, Sn or the like can be formed by plating. An OSP film may be formed by spraying an organic material.

The wiring substrate of the embodiment is not limited to those having the structures illustrated in the drawings and those having the structures, shapes, and materials exemplified herein. For example, one or more conductor layers each having wirings with different conductor thicknesses can be provided among the conductor layers forming the wiring substrate. In the description of the embodiment, two wirings (the first wiring and the second wiring) having different thicknesses are exemplified. However, it is also possible that a third wiring different in conductor thickness and L/S from the first wiring and the second wiring is formed in the same conductor layer. The first build-up part and the second build-up part each can include any number of insulating layers and any number of conductor layers. The number of insulating layers and conductor layers of the first build-up part and the number of insulating layers and conductor layers of the second build-up part formed on both sides of the core substrate may be different from each other.

In the wiring substrate described in Japanese Patent Application Laid-Open Publication No. 2015-41630, since the conductor thickness is uniform in the same (single) wiring layer, when multiple wiring patterns are formed in a single wiring layer, it is considered that a characteristic impedance of each of multiple wiring patterns mainly depends on a wiring width thereof. It is considered that it is difficult to form multiple wiring patterns having different characteristic impedances in the same wiring layer.

A wiring substrate according to an embodiment of the present invention includes: a core substrate; and a build-up part that is formed on the core substrate and includes alternately laminated insulating layers and conductor layers, and has a first surface and a second surface on the opposite side with respect to the first surface. At least one of the conductor layers has a first wiring and a second wiring in the same conductor layer, the second wiring having a conductor thickness smaller than that of the first wiring. A minimum value of a line width of a wiring pattern of the second wiring is smaller than a minimum value of a line width of a wiring pattern of the first wiring.

According to an embodiment of the present invention, wiring patterns having different conductor thickness and wiring widths are formed in the same conductor layer, and thereby, a wiring substrate can be provided having excellent signal transmission quality in which multiple wiring patterns having more suitable characteristic impedances with respect to signals to be transmitted are provided.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising: a core substrate; and a build-up part formed on the core substrate and comprising a plurality of insulating layers and a plurality of conductor layers, wherein the plurality of conductor layers includes at least one conductor layer having a first wiring and a second wiring such that the second wiring has a conductor thickness smaller than a conductor thickness of the first wiring and that a minimum value of a line width of a wiring pattern of the second wiring is smaller than a minimum value of a line width of a wiring pattern of the first wiring, A wiring substrate, comprising: a core substrate; and a build-up part formed on the core substrate and comprising a plurality of insulating layers and a plurality of conductor layers, wherein the plurality of conductor layers includes at least one conductor layer having a first wiring and a second wiring such that the second wiring has a conductor thickness smaller than a conductor thickness of the first wiring and that a minimum value of a line width of a wiring pattern of the second wiring is smaller than a minimum value of a line width of a wiring pattern of the first wiring, the plurality of conductor layers includes a plurality of conductor layers each having the first wiring and the second wiring, and the plurality of insulating layers in the build-up part includes a plurality of insulating layers each having a dielectric loss tangent of 0.005 or less and a relative permittivity of 3.5 or less at a frequency of 1 GHz such that the conductor layers having the first wiring and the second wiring are formed on surfaces of the insulating layers having the dielectric loss tangent and the relative permittivity, respectively.

2. The wiring substrate according to claim 1, wherein the conductor layer having the first wiring and the second wiring has an upper surface formed such that an arithmetic mean roughness Ra of the upper surface is smaller than 0.3 µm.

3. The wiring substrate according to claim 2, wherein the conductor layer having the first wiring and the second wiring is formed such that the minimum value of the line width of the second wiring is 6 µm or less and that a minimum value of an inter-line space of the second wiring is 6 µm or less.

4. The wiring substrate according to claim 2, wherein the conductor layer having the first wiring and the second wiring is formed such that the conductor thickness of the first wiring is in a range of 10 µm to 35 µm and that the conductor thickness of the second wiring is less than 10 µm.

5. The wiring substrate according to claim 2, wherein the plurality of conductor layers includes a conductor layer including a plurality of component mounting pads formed in a plurality of component mounting regions such that at least one of the first wiring and the second wiring of the conductor layer connects component mounting pads in different component mounting regions.

6. The wiring substrate according to claim 5, wherein the conductor layer having the first wiring and the second wiring is a first conductor layer from the conductor layer having the component mounting pads on a core substrate side.

7. The wiring substrate according to claim 2, wherein the conductor layer having the first wiring and the second wiring is formed such that the first wiring and the second wiring are embedded in one of the insulating layers on a core substrate side with respect to the conductor layer having the first wiring and the second wiring.

8. The wiring substrate according to claim 1, wherein the conductor layer having the first wiring and the second wiring is formed such that the minimum value of the line width of the second wiring is 6 µm or less and that a minimum value of an inter-line space of the second wiring is 6 µm or less.

9. The wiring substrate according to claim 8, wherein the conductor layer having the first wiring and the second wiring is formed such that the conductor thickness of the first wiring is in a range of 10 μm to 35 μm and that the conductor thickness of the second wiring is less than 10 μm.

10. The wiring substrate according to claim 8, wherein the plurality of conductor layers includes a conductor layer including a plurality of component mounting pads formed in a plurality of component mounting regions such that at least one of the first wiring and the second wiring of the conductor layer connects component mounting pads in different component mounting regions.

11. The wiring substrate according to claim 10, wherein the conductor layer having the first wiring and the second wiring is a first conductor layer from the conductor layer having the component mounting pads on a core substrate side.

12. The wiring substrate according to claim 8, wherein the conductor layer having the first wiring and the second wiring is formed such that the first wiring and the second wiring are embedded in one of the insulating layers on a core substrate side with respect to the conductor layer having the first wiring and the second wiring.

13. The wiring substrate according to claim 1, wherein the conductor layer having the first wiring and the second wiring is formed such that the conductor thickness of the first wiring is in a range of 10 μm to 35 μm and that the conductor thickness of the second wiring is less than 10 μm.

14. The wiring substrate according to claim 13, wherein the plurality of conductor layers includes a conductor layer including a plurality of component mounting pads formed in a plurality of component mounting regions such that at least one of the first wiring and the second wiring of the conductor layer connects component mounting pads in different component mounting regions.

15. The wiring substrate according to claim 14, wherein the conductor layer having the first wiring and the second wiring is a first conductor layer from the conductor layer having the component mounting pads on a core substrate side.

16. The wiring substrate according to claim 13, wherein the conductor layer having the first wiring and the second wiring is formed such that the first wiring and the second wiring are embedded in one of the insulating layers on a core substrate side with respect to the conductor layer having the first wiring and the second wiring.

17. The wiring substrate according to claim 1, wherein the plurality of conductor layers includes a conductor layer including a plurality of component mounting pads formed in a plurality of component mounting regions such that at least one of the first wiring and the second wiring of the conductor layer connects component mounting pads in different component mounting regions.

18. The wiring substrate according to claim 17, wherein the conductor layer having the first wiring and the second wiring is a first conductor layer from the conductor layer having the component mounting pads on a core substrate side.

19. The wiring substrate according to claim 17, wherein the conductor layer having the first wiring and the second wiring is formed such that the first wiring and the second wiring are embedded in one of the insulating layers on a core substrate side with respect to the conductor layer having the first wiring and the second wiring.

20. The wiring substrate according to claim 1, wherein the conductor layer having the first wiring and the second wiring is formed such that the first wiring and the second wiring are embedded in one of the insulating layers on a core substrate side with respect to the conductor layer having the first wiring and the second wiring.

* * * * *